(12) United States Patent
Barson (10) Patent No.: US 10,762,770 B1
(45) Date of Patent: Sep. 1, 2020

(54) DETECTING FAULTS ON A SPUR WIRED ALARM CIRCUIT

(71) Applicant: Honeywell International Inc., Morris Plains, NJ (US)

(72) Inventor: Michael Barson, Nuneaton (GB)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/422,451

(22) Filed: May 24, 2019

(51) Int. Cl.
  *G08B 29/06* (2006.01)
  *G01R 27/14* (2006.01)
  *G01R 31/28* (2006.01)
  *G08B 29/12* (2006.01)

(52) U.S. Cl.
  CPC ............ *G08B 29/06* (2013.01); *G01R 27/14* (2013.01); *G01R 31/2836* (2013.01); *G08B 29/123* (2013.01)

(58) Field of Classification Search
  None
  See application file for complete search history.

(56) References Cited

U.S. PATENT DOCUMENTS

| | | | |
|---|---|---|---|
| 3,641,539 | A | 2/1972 | Lesher |
| 6,567,001 | B1 | 5/2003 | Barrieau et al. |
| 8,878,552 | B2 | 11/2014 | Galera et al. |
| 10,089,859 | B2 | 10/2018 | Stamer |

FOREIGN PATENT DOCUMENTS

| | | | |
|---|---|---|---|
| EP | 0967585 | B1 | 3/2004 |
| EP | 1777671 | A1 | 4/2007 |
| EP | 2105898 | A2 | 9/2009 |
| EP | 2804163 | B1 | 11/2014 |
| EP | 2916303 | A1 | 9/2015 |
| FR | 3001320 | A1 | 5/2016 |
| WO | 2009087169 | A1 | 7/2009 |
| WO | 2013167899 | A1 | 11/2013 |

*Primary Examiner* — Thomas S McCormack
(74) *Attorney, Agent, or Firm* — Brooks, Cameron & Huebsch, PLLC (57) ABSTRACT

Devices, methods, and systems for detecting faults on a spur wired alarm circuit are described herein. One system includes a bipolar capacitor coupled to a last device on a spur wired alarm circuit, a voltage supply coupled to the spur wired alarm circuit, and a controller configured to operate the voltage supply such that a current flows through the spur wired alarm circuit, operate the voltage supply such that the current stops flowing through the spur wired alarm circuit for a particular amount of time, determine a voltage across the bipolar capacitor while the current has stopped flowing through the spur wired alarm circuit, and determine whether a fault has occurred on the spur wired alarm circuit based on the determined voltage.

20 Claims, 5 Drawing Sheets

DETECTING FAULTS ON A SPUR WIRED ALARM CIRCUIT

TECHNICAL FIELD

The present disclosure relates generally to devices, methods, and systems for detecting faults on a spur wired alarm circuit.

BACKGROUND

A fire alarm system can include a number of devices (e.g., alarm devices) that can detect, and/or provide a warning, when smoke, fire, and/or carbon monoxide, among other emergency situations, are present in a facility. Such warnings may be audio and/or visual warnings, for example.

In a conventional fire alarm system, the alarm devices are wired as spurs on the circuit of the alarm system. In such systems, it is important to detect faults that may be occurring on the spur wired alarm circuit (e.g., on the wiring of the circuit) before the faults can cause a loss of functionality to occur in the alarm devices. However, previous approaches may not be capable of effectively detecting such faults before a loss of functionality occurs.

DETAILED DESCRIPTION

Devices, methods, and systems for detecting faults on a spur wired alarm circuit are described herein. For example, an embodiment includes a bipolar capacitor coupled to a last device on a spur wired alarm circuit, a voltage supply coupled to the spur wired alarm circuit, and a controller configured to operate the voltage supply such that a current flows through the spur wired alarm circuit, operate the voltage supply such that the current stops flowing through the spur wired alarm circuit for a particular amount of time, determine a voltage across the bipolar capacitor while the current has stopped flowing through the spur wired alarm circuit, and determine whether a fault has occurred on the spur wired alarm circuit based on the determined voltage.

Embodiments of the present disclosure can use a low-cost bipolar capacitor coupled (e.g., fitted) to the last device (e.g., last alarm device) on the spur wired circuit of a fire alarm system to detect faults that may be occurring on the spur wired alarm circuit (e.g., on the wiring of the circuit) in a cheaper, easier, and more effective manner than previous fault detection approaches. For instance, embodiments of the present disclosure can detect faults that may be occurring in the spur wired alarm circuit before the faults can cause a loss of functionality to occur in the alarm devices.

For example, previous fault detection approaches may monitor the resistance at the end of the spur wired alarm circuit (e.g., the "end of line resistance") to detect open circuit (e.g., series resistance) or short circuit (e.g., parallel resistance) faults while the circuit is in a quiescent (e.g., non-alarm) state. However, this resistance must be a very high value (e.g., 4 k or 10 k Ohm), so that it does not significantly load the circuit during an alarm state. As such, only very large changes in the wiring resistance can be detected by the monitoring circuit using this approach. However, due to the typical alarm voltage and alarm current (e.g., 24 Volts and greater than 0.5 Amps, respectively), the maximum series resistance may be limited to 10 Ohms, and as such a small increase in this resistance caused by a series resistance fault could cause the alarm devices to fail during an alarm state.

As such, the monitoring circuit needs to be able to accurately measure small resistance values with a resolution of a fraction of an Ohm, which is not possible using such an end of line resistance technique. Further, if the spur wired alarm circuit is lightly loaded, the maximum series resistance limit could be higher. As such, the monitoring circuit would need to be able to accurately measure resistances over a wide range of resistance values. Additionally, the monitoring circuit would need to be able to accurately measure the large resistance values (e.g., greater than 1 k Ohm) associated with a parallel resistance fault.

Embodiments of the present disclosure, however, are capable of accurately measuring and detecting parallel resistance faults to well above 1 k Ohm (e.g., greater than 10 k Ohm), while also being capable of accurately measuring and detecting series resistance faults with a resolution down to less than 1 Ohm (e.g., a fraction of an Ohm). Further, embodiments of the present disclosure can accurately measure resistances over a wide range of resistance values.

As an additional example, previous fault detection approaches may measure the series resistance and parallel resistance of the spur wired alarm circuit during the quiescent (e.g., non-alarm) state, and use these measurements to calculate what the voltage drop would be at the end of the spur during the alarm state. However, for this calculation to be accurate, it must be assumed that the previously measured resistance values have not changed, other faults (e.g., wiring faults) have not occurred in the alarm devices, the load current of the circuit remains stable (e.g., no variations, such as changes to the alarm tones, have been made to the alarm devices), the voltage supplied to the circuit remains stable, and the load distribution of the circuit has not been changed. Further, it may not be practical (e.g., it would be complex and expensive) to directly measure the voltage at the end of the spur, either during commissioning or testing of the fire alarm system.

Embodiments of the present disclosure, however, can monitor the series and parallel resistances of the circuit during both the non-alarm and alarm states. As such, embodiments of the present disclosure can take into account the effects of any changes that may have occurred to the resistance values, load current, load distribution, and/or voltage supplied while the circuit is in the alarm state in detecting faults in the circuit.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that mechanical, electrical, and/or process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

As used herein, "a", "an", or "a number of" something can refer to one or more such things, while "a plurality of" something can refer to more than one such things. For example, "a number of devices" can refer to one or more devices, while "a plurality of devices" can refer to more than one device.

Figure 1:
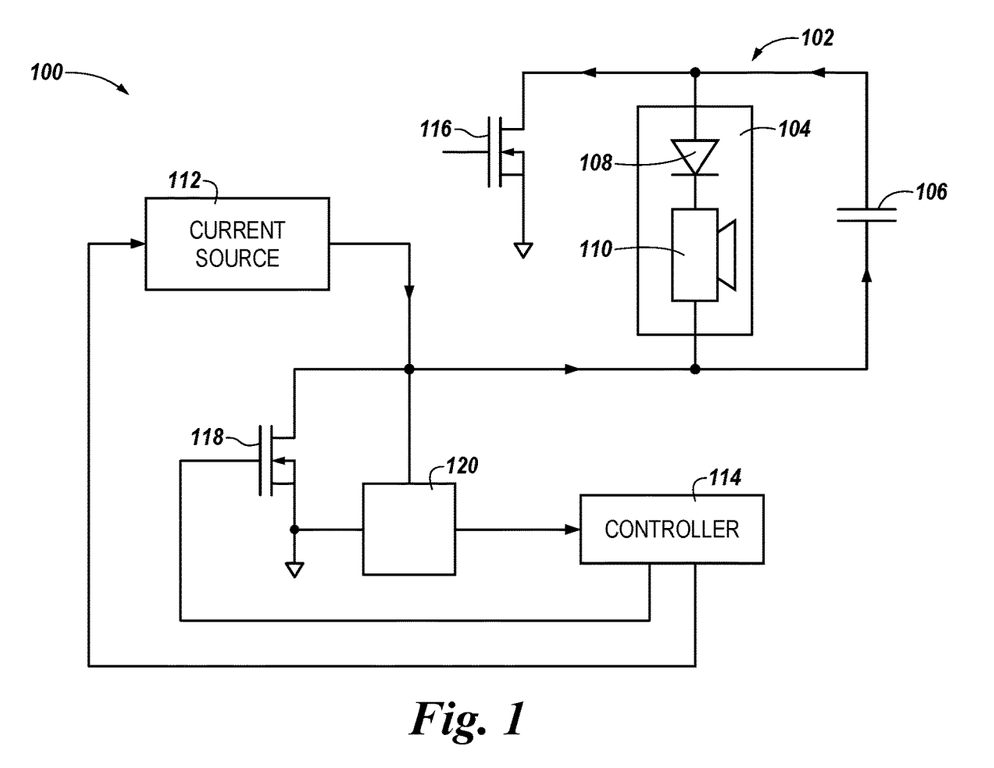
FIG. 1 illustrates an example of a system for detecting faults on a spur wired alarm circuit in accordance with an embodiment of the present disclosure.

FIG. 1 illustrates an example of a system 100 for detecting faults on a spur wired alarm circuit 102 in accordance with an embodiment of the present disclosure. Spur wired alarm circuit 102 can be, for example, the fire alarm circuit of a fire alarm system of a facility (e.g., building). For instance, spur wired alarm circuit 102 can include a number of devices (e.g., alarm devices) of the fire alarm system wired as spurs on the fire alarm circuit. However, for simplicity and so as not to obscure embodiments of the present disclosure, only the last (e.g., end of line) device on spur wired alarm circuit 102 (e.g., alarm device 104) is illustrated in FIG. 1. That is, alarm device 104 illustrated in FIG. 1 is wired as the last spur on the alarm circuit of the fire alarm system. As used herein, the term "spur wired circuit" can be used to refer to, and/or mean, a spur wired alarm circuit in accordance with embodiments of the present disclosure.

The alarm devices of spur wired circuit 102 can be devices that can detect, and/or provide a notification (e.g., warning), when smoke, fire, and/or carbon monoxide, among other emergency situations, are present in the facility, in order to alert the occupants of the facility to evacuate or take some other action. For instance, the alarm devices can include an audio notification mechanism, such as a speaker or siren (e.g., the warning provided by the device can be and/or include an audio warning), and/or a visual notification mechanism, such as a display, light, sign, or strobe (e.g., the warning provided by the device can be and/or include a visual warning). In the example illustrated in FIG. 1, alarm device 104 includes an audio notification mechanism 110 and diode 108 wired on spur wired circuit 102.

As shown in FIG. 1, system 100 can include a bipolar capacitor 106 coupled (e.g., fitted) to the last (e.g., end of line) device on spur wired circuit 102 (e.g., alarm device 104). Bipolar capacitor 106 can be a low cost, AC voltage rated capacitor having a capacitance value that is far greater than the expected wiring (e.g., cable) capacitance of spur wired circuit 102, and an equivalent series resistance that is small compared to the expected series resistance of spur wired circuit 102.

As shown in FIG. 1, system 100 can include a current source 112 coupled to one leg of spur wired circuit 102, and a transistor 116 coupled to the other leg of spur wired circuit 102. Transistor 116 can be, for instance, a metal-oxide semiconductor field-effect transistor (MOSFET) that can act as a switch to provide (e.g., supply) a voltage to spur wired circuit 102, and current source 112 can be a configurable current source that can be periodically switched on to provide a current to spur wired circuit 102, as will be further described herein.

As shown in FIG. 1, system 100 can include a controller 114. Controller 114 can be, for instance, a microcontroller that includes a processor and a memory. The memory can be any type of storage medium that can be accessed by the processor to perform various examples of the present disclosure. For example, the memory can be a non-transitory computer readable medium having computer readable instructions (e.g., computer program instructions) stored thereon that are executable by the processor to detect faults on spur wired circuit 102 in accordance with the present disclosure. That is, the processor can execute the executable instructions stored in the memory to detect faults on spur wired circuit 102 in accordance with the present disclosure.

The memory can be volatile or nonvolatile memory. The memory can also be removable (e.g., portable) memory, or non-removable (e.g., internal) memory. For example, the memory can be random access memory (RAM) (e.g., dynamic random access memory (DRAM), resistive random access memory (RRAM), and/or phase change random access memory (PCRAM)), read-only memory (ROM) (e.g., electrically erasable programmable read-only memory (EEPROM) and/or compact-disk read-only memory (CD-ROM)), flash memory, a laser disk, a digital versatile disk (DVD) or other optical disk storage, and/or a magnetic medium such as magnetic cassettes, tapes, or disks, among other types of memory.

As an example, while spur wired circuit 102 (e.g., the alarm devices of spur wired circuit 102) is in a quiescent state (e.g., a non-alarm state such as, for instance, a test state), controller 114 can operate (e.g., switch on) current source 112 to provide a pulse current to spur wired circuit 102. For instance, the amount of current provided to spur wired circuit 102 can increase (e.g., rise) with time, with the rate of the current increase, as well as the maximum amount of current that is provided to the circuit, being controlled by controller 114.

While the current is being provided to spur wired circuit 102, controller 114 can operate (e.g., switch on) transistor 116 to provide a positive voltage supply to spur wired circuit 102, such that the current flows through spur wired circuit. The current can flow through spur wired circuit 102 in the direction indicated by the arrows in FIG. 1, which can be in the reverse direction from which current flows through spur wired circuit 102 while the spur wired circuit 102 is in a non-quiescent state (e.g., an active state such as, for instance, an alarm state).

Figure 3:
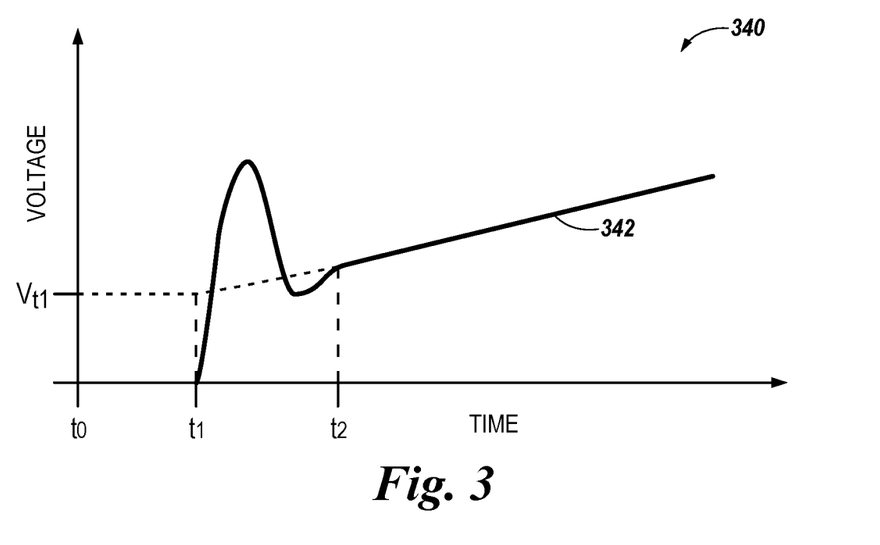
FIG. 3 illustrates a plot of an example voltage step function used to determine the series resistance of a spur wired alarm circuit in accordance with an embodiment of the present disclosure.

Controller 114 can determine the corresponding voltage drop across spur wired circuit 102, and determine the resistance (e.g., series resistance) of spur wired circuit 102 based on this determined voltage drop. For example, while the current is being provided to spur wired circuit 102, the voltage across bipolar capacitor 106 may comprise a voltage step function that appears at current source 112 (e.g., across filter 120 illustrated in FIG. 1). Controller 114 can sample this voltage step function to determine (e.g., measure) the series resistance of spur wired circuit 102.

Figure 2:
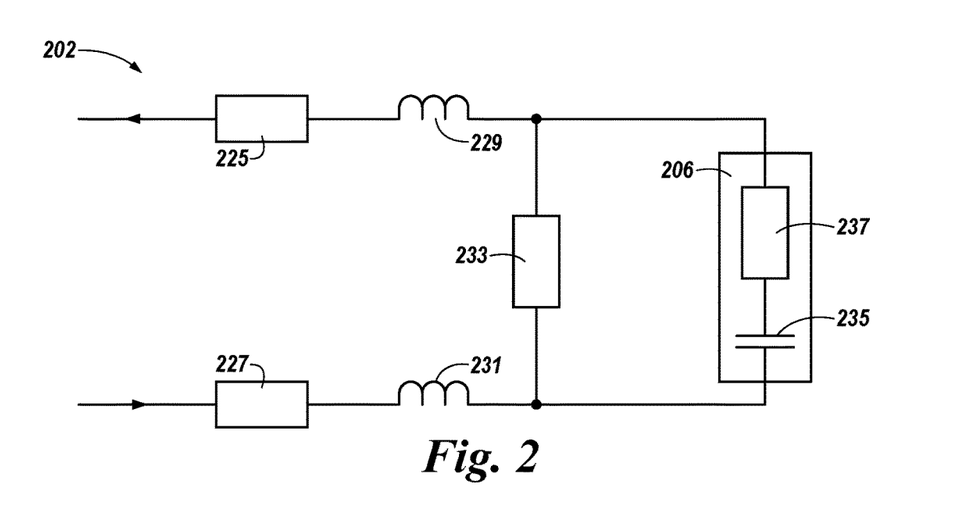
FIG. 2 illustrates a schematic diagram of the equivalent circuit parameters of a spur wired alarm circuit in accordance with an embodiment of the present disclosure.

For example, the voltage measured after time t2 described in connection with FIG. 3 can be given by:

$$V=(I \times T)/C+(I \times R)$$

where I is the amount of current being provided to spur wired circuit 102, T is the amount of time for which the current has been provided to spur wired circuit 102, C is the capacitance of bipolar capacitor 106, and (I×T)/C is the voltage across bipolar capacitor 106 at time T. Accordingly, controller 114 can determine the voltage across bipolar capacitor 106 based on the values of I, T, and C according to the above formula. Controller 114 can then determine the total resistance of spur wired circuit 102 by subtracting the voltage across bipolar capacitor 106 and using Ohm's law (e.g., at time t1 described in connection with FIG. 3, Vt1=I×R, where Vt1 is the determined voltage across the spur wired circuit, I is the amount of current being provided to spur wired circuit 102, and R is the total resistance of spur wired circuit 102). The known inherent resistance of bipolar capacitor 106 can then be removed (e.g., subtracted) from this total resistance to obtain the series resistance of spur wired circuit 102. An example of the equivalent circuit parameters of spur wired circuit 102, and the voltage step function used to determine the series resistance of spur wired circuit 102, will be further described herein (e.g., in connection with FIGS. 2 and 3, respectively).

When the current is first being provided to (e.g., initially flowing through) spur wired circuit 102, the current flow through spur wired circuit 102 may be dominated by the inherent inductive impedance of the wiring of spur wired circuit 102. Only after a short period of time has passed may the current flow only depend on the resistance of spur wired circuit 102 (e.g., on the series resistance of the circuit and the inherent resistance of bipolar capacitor 106). Accordingly, in some embodiments, the voltage across bipolar capacitor 106 may not be determined (e.g., the voltage step function may not be sampled) until after a particular amount of time has passed from the initial time at which the current is provided to spur wired circuit 102, in order to ensure the effects of the inductive impedance of the wiring has ended. The inductance to resistance ratio of spur wired circuit 102 could also be determined (e.g., calculated) by sampling the peak inductive impedance overshoot, and comparing it to the determined series resistance.

Further, to remove the effect of any overshoot on the determination of the series resistance of spur wired circuit 102, a pulse blanking and filtering technique could be used by controller 114 to sample the voltage step function after a voltage overshoot occurs. Alternatively, controller 114 may sample the voltage step function after a simple filter, using an analog to digital converter (ADC). Further, controller 114 can adjust current source 112 to increase the amount of current provided to spur wired circuit 102 if the determined series resistance of spur wired circuit 102 is low, in order to obtain a good measurement resolution of the series resistance.

Controller 114 can determine whether a series resistance fault (e.g., a partial open circuit) has occurred on spur wired circuit 102 based on the determined series resistance. For example, controller 114 can determine whether a series resistance fault has occurred based on whether the determined series resistance meets or exceeds a particular (e.g., maximum) series resistance threshold. For instance, if the determined series resistance meets or exceeds the threshold, controller 114 can determine a fault has occurred; if the determined series resistance does not meet or exceed the threshold, controller 114 can determine that a fault has not occurred.

The maximum series resistance threshold may depend on the load on spur wired circuit 102 while the circuit is in the active (e.g., alarm) state, including, for instance, how the load is distributed on the circuit. In some embodiments, this threshold may be pre-determined, and input into controller 114 (e.g., the controller can receive the threshold as an input). In some embodiments, this threshold may be automatically determined by controller 114 while spur wired circuit 102 is in a non-quiescent (e.g., active) state. For instance, controller 114 can determine the threshold based on (e.g., by measuring) the amount of current drawn by spur wired circuit 102 during the non-quiescent state, and the resistance (e.g., the actual resistance) of spur wired circuit 102 during the non-quiescent state.

As an additional example, bipolar capacitor 106 may charge while the current is being provided to spur wired circuit 102 by current source 112 (e.g., while the current provided by current source 112 is flowing through spur wired circuit 102). For instance, if current source 112 is connected to a 5 Volt supply and is set to 0.1 Amps, and bipolar capacitor 106 has a capacitance of 22 microfarads, bipolar capacitor may be fully charged to the 5 Volt supply within a few milliseconds. Once bipolar capacitor 106 is fully charged, the alarm devices of spur wired circuit 102 may be reversed biased, and may draw no current.

Accordingly, controller 114 can operate current source 112 to provide the current to spur wired circuit 102 until bipolar capacitor 106 is fully charged. After bipolar capacitor 106 has become fully charged, controller 114 can operate (e.g., switch off) current source 112 to stop providing the current to spur wired circuit 102, such that the voltage on bipolar capacitor 106 begins to discharge.

After current source 112 has stopped providing the current to spur wired circuit 102 (e.g., while bipolar capacitor 106 is discharging), controller 114 can determine the voltage drop across bipolar capacitor 106, and determine the resistance (e.g., parallel resistance) of spur wired circuit 102 based on this determined voltage drop. For example, after the current has stopped being provided to spur wired circuit 102, the voltage drop across bipolar capacitor 106 may comprise a discharge voltage that appears at current source 112 (e.g., across filter 120 illustrated in FIG. 1). Controller 114 can sample this discharge voltage to determine (e.g., measure) the parallel resistance of spur wired circuit 102.

For example, the time constant associated with spur wired circuit 102 (e.g., the amount of time it takes for bipolar capacitor 106 to discharge 36.8% of its charge) can be given by T=R×C, where T is the time constant, R is the parallel resistance of spur wired circuit 102, and C is the capacitance of bipolar capacitor 106. Accordingly, controller 114 can determine (e.g., calculate) the time constant based on the determined voltage drop across bipolar capacitor 106 after the current has stopped being provided to spur wired circuit 102 (e.g., by sampling the discharge voltage), and then determine the parallel resistance of spur wired circuit 102 based on the determined time constant and the capacitance of bipolar capacitor 106. An example of the equivalent circuit parameters of spur wired circuit 102, and the discharge voltage used to determine the parallel resistance of spur wired circuit 102, will be further described herein (e.g., in connection with FIGS. 2 and 4, respectively).

Controller 114 can determine whether a parallel resistance fault (e.g., a partial short circuit) has occurred on spur wired circuit 102 based on the determined parallel resistance. For example, controller 114 can determine whether a parallel resistance fault has occurred based on whether the determined parallel resistance meets or exceeds a particular parallel resistance threshold. For instance, if the determined parallel resistance meets or exceeds the threshold, controller 114 can determine a fault has occurred; if the determined parallel resistance does not meet or exceed the threshold, controller 114 can determine that a fault has not occurred.

As shown in FIG. 1, system 100 can include an additional transistor (e.g., MOSFET) 118 coupled to one leg of spur wired circuit 102 (e.g., the same leg to which current source 112 is coupled). After the voltage drop across bipolar capacitor 106 while the capacitor is discharging has been determined (e.g., after the parallel resistance of spur wired circuit 102 has been determined), controller 114 can switch on transistor 118 to remove spur wired circuit 102 from the test state (e.g., to terminate the test).

FIG. 2 illustrates a schematic diagram of the equivalent circuit parameters of spur wired circuit 202 in accordance with an embodiment of the present disclosure. Spur wired circuit 202 can be, for instance, spur wired circuit 102 previously described in connection with FIG. 1. For instance, as shown in FIG. 2, spur wired circuit 202 can include a bipolar capacitor 206 coupled to the last (e.g., end of line) device on spur wired circuit 202, in a manner analogous to bipolar capacitor 106 previously described in connection with FIG. 1. Bipolar capacitor 206 can have a capacitance 235 and inherent resistance 237, as previously described herein and illustrated in FIG. 2.

As shown in FIG. 2, spur wired circuit 202 can have a series resistance 225, 227 thereon. Series resistance 225, 227 can be determined using bipolar capacitor 206 while current is being provided to spur wired circuit 202 by current source 112, and can be used to determine whether a fault (e.g., a series resistance fault) has occurred on spur wired circuit 202, as previously described in connection with FIG. 1.

As shown in FIG. 2, spur wired circuit 202 (e.g., the wiring of the circuit) can have an inherent inductive impedance 229, 231. Inherent inductive impedance 229, 231 may dominate the current flow through spur wired circuit 202 when the current is first being provided to spur wired circuit 202, as previously described in connection with FIG. 1.

As shown in FIG. 2, spur wired circuit 202 can have a parallel resistance 233 thereon. Parallel resistance 233 can be determined using bipolar capacitor 206 after the current has stopped being provided to spur wired circuit 202 by current source 112, and can be used to determine whether a fault (e.g., a parallel resistance fault) has occurred on spur wired circuit 202, as previously described in connection with FIG. 1.

FIG. 3 illustrates a plot (e.g., graph) 340 of an example voltage step function 342 used to determine the series resistance of a spur wired circuit in accordance with an embodiment of the present disclosure. The spur wired circuit can be, for instance, spur wired circuit 102 previously described in connection with FIG. 1, and voltage step function 342 can be the voltage across bipolar capacitor 106 while a current is being provided to spur wired circuit 102, as previously described in connection with FIG. 1.

In the example illustrated in FIG. 3, the current is first provided to the spur wired circuit (e.g., begins to flow through the spur wired circuit) at an initial time t1. However, for a short period of time after the current is first provided to the spur wired circuit (e.g., from time t1 to time t2 shown in FIG. 3), the current flow through the spur wired circuit, and therefore voltage step function 342, may be dominated by the inherent inductive impedance of the wiring of the spur wired circuit, as illustrated in FIG. 3 and previously described herein (e.g., in connection with FIG. 1). Accordingly, the voltage given by voltage step function 342 from time t1 to time t2 may not provide an accurate determination (e.g., measurement) of the voltage across bipolar capacitor 106 during that time period.

After this period of time has passed (e.g., after time t2), however, the current flow through the spur wired circuit may depend only on the resistance (e.g., series resistance) of the spur wired circuit, as previously described herein. Accordingly, after time t2, voltage step function 342 can be given by $V=(I \times T)/C+(I \times R)$, and can be used to determine the voltage across bipolar capacitor 106, as previously described herein. For instance, in the example illustrated in FIG. 3, the voltage across spur wired circuit 102 at time t1 (e.g., voltage V shown in FIG. 3) can be determined (e.g., extrapolated) from the slope of voltage step function 342 after time t2. This determined voltage can then be used to determine the resistance (e.g., series resistance) of the spur wired circuit, as previously described herein.

Figure 4:
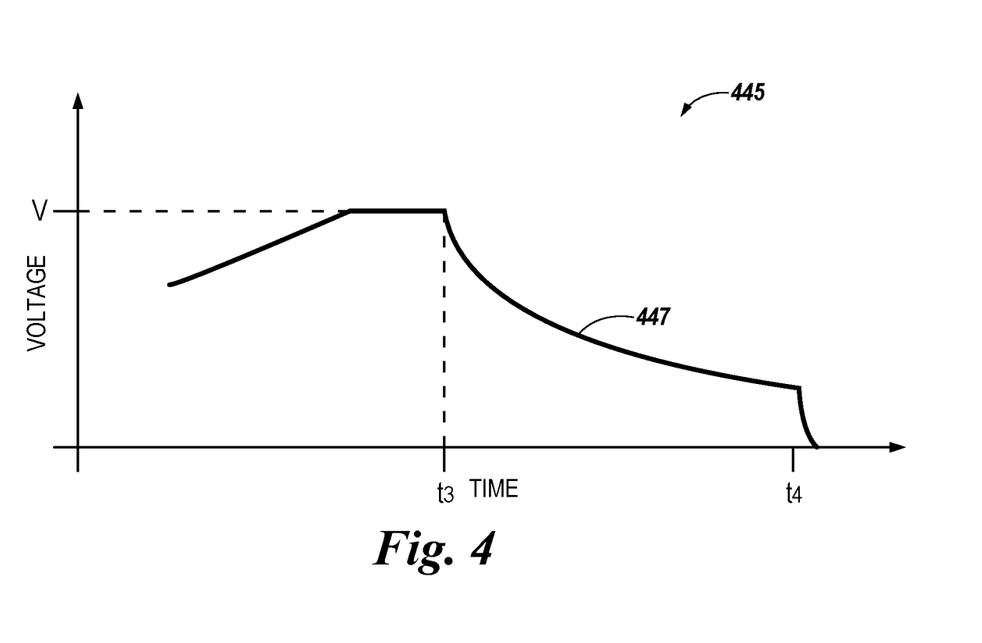
FIG. 4 illustrates a plot of an example discharge voltage used to determine the parallel resistance of a spur wired alarm circuit in accordance with an embodiment of the present disclosure.

FIG. 4 illustrates a plot (e.g., graph) 445 of an example discharge voltage 447 used to determine the parallel resistance of a spur wired circuit in accordance with an embodiment of the present disclosure. The spur wired circuit can be, for instance, spur wired circuit 102 previously described in connection with FIG. 1, and discharge voltage 447 can be the voltage across bipolar capacitor 106 after a current has stopped being provided to spur wired circuit 102, as previously described in connection with FIG. 1.

For example, a current (e.g., the current previously described in connection with FIG. 3) can be provided to the spur wired circuit until bipolar capacitor 106 is fully charged, as previously described herein; once the capacitor has become fully charged, the voltage across the bipolar capacitor will be voltage V shown in FIG. 4. After the bipolar capacitor has become fully charged (e.g., at time t3 shown in FIG. 4), the current may stop being provided to the spur wired circuit, and the voltage across the bipolar capacitor may comprise discharge voltage 447 as the bipolar capacitor discharges.

At time t4 shown in FIG. 4, discharge voltage 447 has reached the voltage at which the bipolar capacitor has discharged 36.8% of its charge. Accordingly, the amount of time from time t3 to time t4 can be the time constant associated with the spur wired circuit, which can be used to determine the resistance (e.g., parallel resistance) of the spur wired circuit, as previously described herein.

Figure 5:
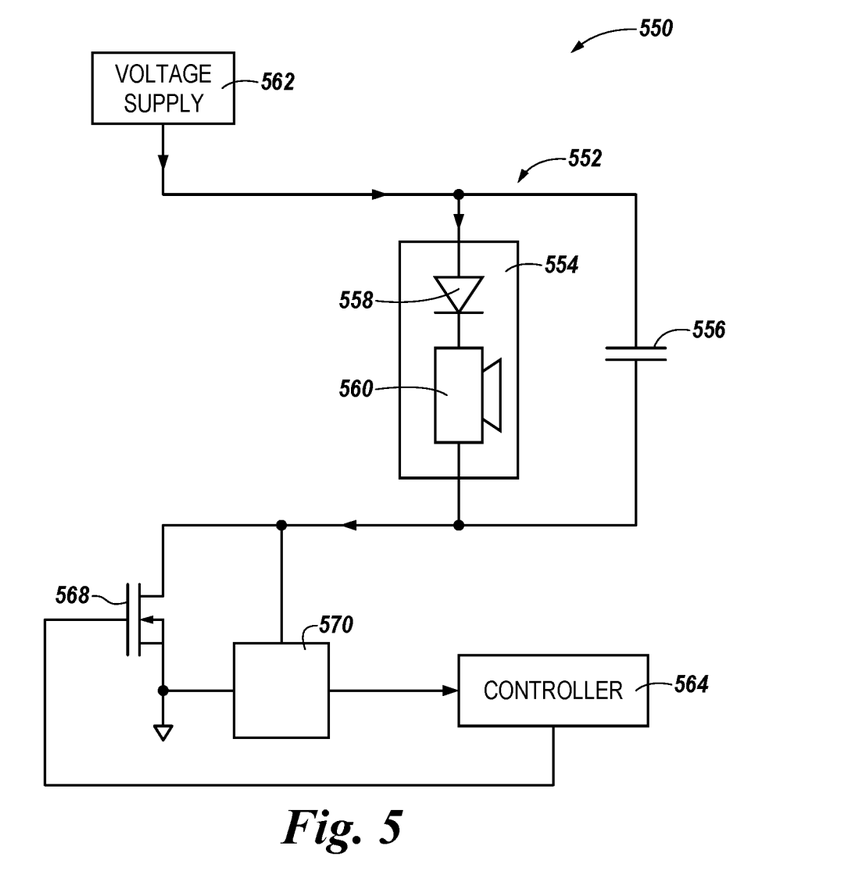
FIG. 5 illustrates an example of a system for detecting faults on a spur wired alarm circuit when the alarm circuit is activated in accordance with an embodiment of the present disclosure.

FIG. 5 illustrates an example of a system 550 for detecting faults on a spur wired circuit 552 when the circuit is activated in accordance with an embodiment of the present disclosure. Spur wired circuit 552 can be, for example, the fire alarm circuit of a fire alarm system of a facility (e.g., building), and can include a number of devices (e.g., alarm devices) of the fire alarm system wired as spurs on the fire alarm circuit, in a manner analogous to spur wired circuit 102 previously described in connection with FIG. 1. However, for simplicity and so as not to obscure embodiments of the present disclosure, only the last (e.g., end of line) device on spur wired circuit 552 (e.g., alarm device 554) is illustrated in FIG. 5. That is, alarm device 554 illustrated in FIG. 5 is wired as the last spur on the alarm circuit of the fire alarm system, in a manner analogous to alarm device 104 previously described in connection with FIG. 1.

The alarm devices of spur wired circuit 552 can be devices that can detect, and/or provide a notification (e.g., warning), when smoke, fire, and/or carbon monoxide, among other emergency situations, are present in the facility, in order to alert the occupants of the facility to evacuate or take some other action, in a manner analogous to the alarm devices of spur wired circuit 102 previously described in connection with FIG. 1. For instance, the alarm devices can include an audio notification mechanism, and/or a visual notification mechanism, as previously described herein. In the example illustrated in FIG. 5, alarm device 554 includes an audio notification mechanism 560 and diode 558 wired on spur wired circuit 552, in a manner analogous to alarm device 104 previously described in connection with FIG. 1.

As shown in FIG. 5, system 550 can include a bipolar capacitor 556 coupled (e.g., fitted) to the last (e.g., end of line) device on spur wired circuit 552 (e.g., alarm device 554). Bipolar capacitor 556 can be (e.g., have characteristics) analogous to bipolar capacitor 106 previously described in connection with FIG. 1.

As shown in FIG. 5, system 550 can include a voltage supply 562 coupled to one leg of spur wired circuit 552, and a transistor 568 coupled to the other leg of spur wired circuit 552. Transistor 568 can be, for instance, a MOSFET that can act as a switch to connect voltage supply 562 to, and disconnect voltage supply 562 from, spur wired circuit 552 such that a current flows through, or stops flowing through, spur wired circuit 552, as will be further described herein.

As shown in FIG. 5, system 550 can include a controller 564. Controller 564 can be, for instance, a microcontroller that includes a processor and a memory, in a manner analogous to controller 114 previously described in connection with FIG. 1. For instance, the memory can be a non-transitory computer readable medium having computer readable instructions stored thereon that are executable by the processor to detect faults on spur wired circuit 102 in accordance with the present disclosure.

As an example, while spur wired circuit 552 (e.g., the alarm devices of spur wired circuit 552) is in a non-quiescent state (e.g., an active state such as, for instance, an alarm state), controller 564 can operate voltage supply 562 such that a current flows through spur wired circuit 552. For instance, controller 564 can switch on transistor 568 to connect voltage supply 562 to spur wired circuit 552, such that the current flows through spur wired circuit 552 in the direction indicated by the arrows in FIG. 5. In some embodiments, the current flowing through spur wired circuit 552 can be monitored to ensure it is within the correct limits and/or to confirm that bipolar capacitor 556 is still coupled to alarm device 554, as will be further described herein (e.g., in connection with FIG. 6)

While the current is flowing through spur wired circuit 552, a voltage drop will occur across the wiring resistance of spur wired circuit 552, and bipolar capacitor 556 will charge to the voltage at the end of the spur. As this voltage is stored on bipolar capacitor 556, controller 564 can operate voltage supply 562 such that the current stops flowing through spur wired circuit 552 for a particular amount of time. For instance, controller 564 can switch off transistor 568 to disconnect voltage supply 562 from spur wired circuit 552 for the particular amount of time, such that the current stops flowing through spur wired circuit 552 for the particular amount of time. The particular amount of time can be a short amount of time, such as, for instance, 100 microseconds or less, and can be controlled by controller 564 to limit the overshoot and ringing caused by the inductance of the wiring (e.g., cable) of spur wired circuit 552. While the current has stopped flowing through spur wired circuit 552, the alarm devices of spur wired circuit 552 may run on their internal capacitances, such that the voltage change on bipolar capacitor 556 due to the load current of spur wired circuit 552 may be negligible (e.g., extremely small).

While the current has stopped flowing through spur wired circuit 552, controller 564 can determine the voltage across bipolar capacitor 556. For example, because no current is flowing through spur wired circuit 552, the previous voltage drop across spur wired circuit 552 will appear at the disconnected supply leg of spur wired circuit 552. Accordingly, controller 564 can determine (e.g., monitor) the voltage across voltage supply 562 and/or transistor 568 (e.g., across filter 570 illustrated in FIG. 5) while the current has stopped flowing through spur wired circuit 552, and determine the voltage across bipolar capacitor 556 based on this determined voltage. For instance, controller 564 can determine the voltage across bipolar capacitor 556 while the current has stopped flowing through spur wired circuit 552 by determining the difference between the voltage supplied to spur wired circuit 552 by voltage supply 562 while the current was flowing through spur wired circuit 552 and the voltage across voltage supply 562 and/or transistor 568 determined while the current has stopped flowing through spur wired circuit 552 (e.g., the voltage at the end of the spur is the difference between the supply voltage to spur wired circuit 552 and the voltage appearing at the disconnected supply leg of spur wired circuit 552).

In some embodiments, the voltage across bipolar capacitor 556 while the current has stopped flowing through spur wired circuit 552 can comprise a filtered voltage signal. For instance, the voltage across voltage supply 562 and/or transistor 568 while the current has stopped flowing through spur wired circuit 552 can first be filtered before being sampled by controller 564. In some embodiments, the voltage across bipolar capacitor 556 while the current has stopped flowing through spur wired circuit 552 can comprise an unfiltered voltage signal (e.g., the voltage across voltage supply 562 and/or transistor 568 while the current has stopped flowing through spur wired circuit 552 may not be filtered before being sampled by controller 564). Examples of such filtered and unfiltered voltage signals will be further described herein (e.g., in connection with FIGS. 7A-7B).

When the current has first stopped flowing through spur wired circuit 552, the voltage across voltage supply 562 and/or transistor 568 may be dominated by the inherent inductive impedance of the wiring of spur wired circuit 552. Accordingly, in some embodiments, the voltage across bipolar capacitor 556 may not be determined until after a particular amount of time has passed from the initial time at which the current stops flowing through spur wired circuit 552, in order to ensure the effects of the inductive impedance of the wiring has ended.

Controller 564 can determine whether a fault has occurred on spur wired circuit 552 based on the determined voltage across bipolar capacitor 556 while the current has stopped flowing through spur wired circuit 552. For example, controller 564 can determine whether a fault has occurred based on whether the determined voltage meets or exceeds a particular (e.g., minimum) voltage threshold. For instance, if the determined voltage does not meet or exceed the threshold, controller 564 can determine a fault has occurred; if the determined voltage meets or exceeds the threshold, controller 114 can determine that a fault has not occurred. The minimum voltage threshold can be, for instance, the minimum operating voltage of alarm device 554 (e.g., the minimum amount of voltage needed for alarm device 554 to operate) while the device is in an alarm state.

The determined fault can be, for example, a series resistance fault or a parallel resistance fault. For instance, if a parallel resistance fault has occurred on spur wired circuit 552, it may cause a higher voltage drop to appear on bipolar capacitor 556, and may produce a voltage ramp on the monitored voltage across voltage supply 562 and/or transistor 568 in proportion to the fault load.

Figure 6:
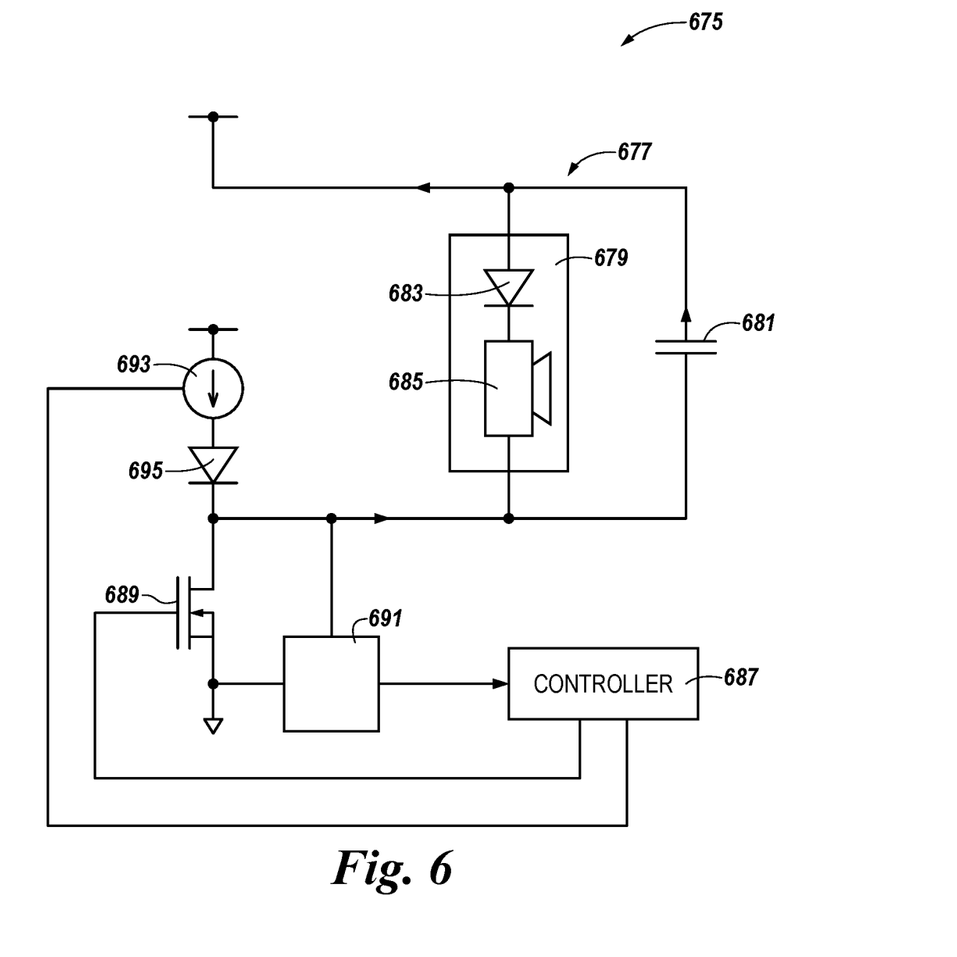
FIG. 6 illustrates an example of a system for detecting faults on a spur wired alarm circuit when the alarm circuit is activated in accordance with an embodiment of the present disclosure.

FIG. 6 illustrates an example of a system 675 for detecting faults on a spur wired circuit 677 when the circuit is activated in accordance with an embodiment of the present disclosure. Spur wired circuit 677 can be analogous to spur wired circuit 552 previously described in connection with FIG. 5. For example, as shown in FIG. 6, spur wired circuit 677 can include an end of line alarm device 679 having an audio notification mechanism 685 and diode 683 wired on spur wired circuit 677, and a bipolar capacitor 681 coupled to end of line alarm device 679, in a manner analogous to spur wired circuit 552.

As shown in FIG. 6, system 675 can include a current source 693 and a transistor (e.g., MOSFET) 689 coupled to one leg of spur wired circuit 677. For instance, current source 693 can be coupled to spur wired circuit 677 via diode 695. Transistor 689 can act as a switch such that current provided by current source 693 flows through, or stops flowing through, spur wired circuit 677, as will be further described herein.

As shown in FIG. 6, system 675 can include a controller 687. Controller 687 can be, for instance, a microcontroller that includes a processor and a memory, in a manner analogous to controllers 114 and 564 previously described in connection with FIGS. 1 and 5, respectively.

As an example, while spur wired circuit 677 is in a non-quiescent state, controller 687 can operate current source 683 such that a current flows through spur wired circuit 677. For instance, controller 687 can switch on transistor 689 to connect current source 683 to spur wired circuit 677, such that the current provided by current source 683 flows through spur wired circuit 677 in the direction indicated by the arrows in FIG. 6.

In some embodiments, the current flowing through spur wired circuit 677 can be monitored to ensure it is within the correct limits and/or to confirm that bipolar capacitor 681 is coupled to alarm device 679. For example, controller 687 can determine (e.g., monitor) the amount of current that flows through spur wired circuit 677, and determine whether (e.g., ensure) the determined current amount is within a particular current range (e.g., the correct limits). As an additional example, controller 687 can determine (e.g., check to confirm that) whether bipolar capacitor 681 is coupled to alarm device 679 based on the determined current amount. For instance, controller 687 can conduct a series resistance check using the determined current amount to determine whether bipolar capacitor 681 is coupled to alarm device 679.

While the current is flowing through spur wired circuit 677, a voltage drop will occur across the wiring resistance of spur wired circuit 677, and bipolar capacitor 681 will charge to the voltage at the end of the spur, in a manner analogous to that previously described in connection with FIG. 5. As this voltage is stored on bipolar capacitor 681, controller 687 can operate current source 683 such that the current stops flowing through spur wired circuit 677 for a particular amount of time. For instance, controller 687 can switch off transistor 689 to disconnect current source 693 from spur wired circuit 677 for the particular amount of time, such that the current provided by current source 693 stops flowing through spur wired circuit 677 for the particular amount of time. The particular amount of time can be a short amount of time (e.g., 100 microseconds or less), as previously described in connection with FIG. 5.

While the current has stopped flowing through spur wired circuit 677, controller 687 can determine the voltage across bipolar capacitor 681. For example, because no current is flowing through spur wired circuit 677, the previous voltage drop across spur wired circuit 677 will appear at the disconnected supply leg of spur wired circuit 677, in a manner analogous to that previously described in connection with FIG. 5. Accordingly, controller 687 can determine (e.g., monitor) the voltage across transistor 689 (e.g., across filter 691 illustrated in FIG. 6) while the current has stopped flowing through spur wired circuit 677, and determine the voltage across bipolar capacitor 681 based on this determined voltage. For instance, the voltage across bipolar capacitor 681 can be the difference between the supply voltage to spur wired circuit 677 and the voltage across transistor 689, in a manner analogous to that previously described in connection with FIG. 5.

The voltage across bipolar capacitor 681 while the current has stopped flowing through spur wired circuit 677 can comprise a filtered voltage signal or an unfiltered voltage signal, in a manner analogous to the voltage across bipolar capacitor 556 previously described in connection with FIG. 5. Further, the voltage across bipolar capacitor 681 may not be determined until after a particular amount of time has passed from the initial time at which the current stops flowing through spur wired circuit 677, in order to ensure the effects of the inductive impedance of the wiring has ended in a manner analogous to that previously described in connection with FIG. 5.

Controller 687 can determine whether a fault (e.g., a series resistance fault or a parallel resistance fault) has occurred on spur wired circuit 677 based on the determined voltage across bipolar capacitor 681 while the current has stopped flowing through spur wired circuit 677. For example, controller 687 can determine whether a fault has occurred based on whether the determined voltage meets or exceeds a particular (e.g., minimum) voltage threshold, in a manner analogous to that previously described in connection with FIG. 5.

Figure 7A:
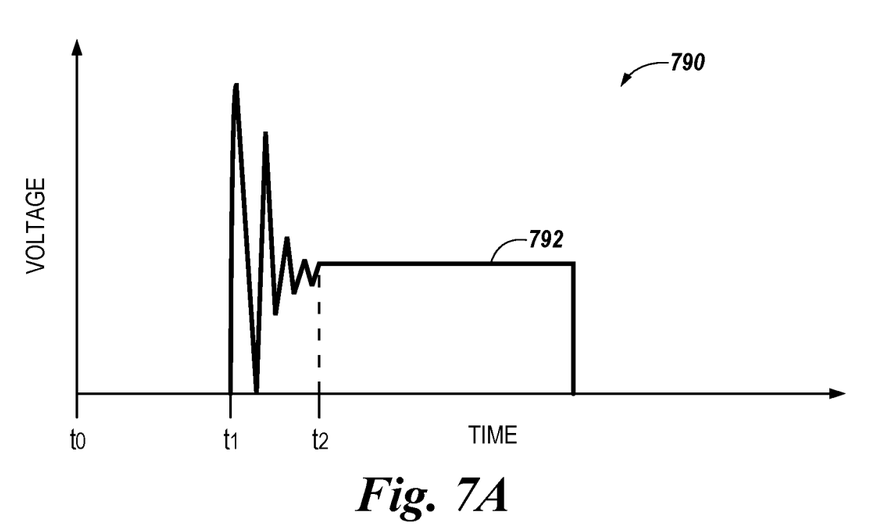
FIGS. 7A-7B illustrate plots of example voltage signals used to determine whether a fault has occurred on a spur wired alarm circuit in accordance with an embodiment of the present disclosure.
Figure 7B:
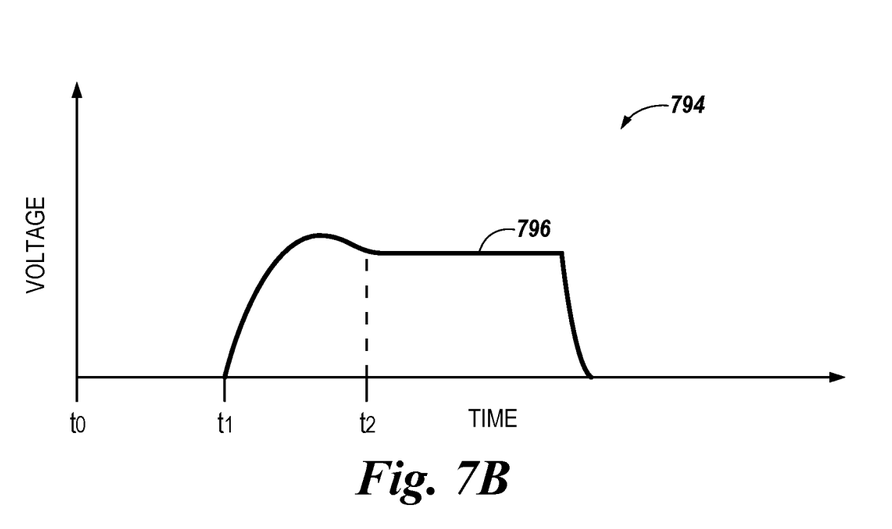

FIGS. 7A-7B illustrate plots of example voltage signals used to determine whether a fault has occurred on a spur wired circuit in accordance with an embodiment of the present disclosure. For example, FIG. 7A illustrates a plot 790 of an unfiltered voltage signal 792 used to determine whether a fault has occurred on a spur wired circuit in accordance with an embodiment of the present disclosure, and FIG. 7B illustrates a plot 794 of a filtered voltage signal 796 used to determine whether a fault has occurred on a spur wired circuit in accordance with an embodiment of the present disclosure. The spur wired circuit can be, for example, spur wired circuit 552 and/or 677 previously described in connection with FIGS. 5 and 6, respectively, and voltage signals 792 and 796 can be the voltage across bipolar capacitor 556 and/or 681 after a current has stopped flowing through the spur wired circuit, as previously described in connection with FIGS. 5 and 6, respectively.

In the examples illustrated in FIGS. 7A-7B, the current stops flowing through the spur wired circuit at an initial time t1. However, for a short period of time after the current first stops flowing through the spur wired circuit (e.g., from time t1 to time t2 shown in FIGS. 7A-7B), the current flow through the spur wired circuit, and therefore voltage signals 792 and 796, may be dominated by the inherent inductive impedance of the wiring of the spur wired circuit, as illustrated in FIGS. 7A-7B and previously described herein (e.g., in connection with FIG. 5). Accordingly, the voltage given by voltage signals 792 and 796 from time t1 to time t2 may not provide an accurate determination (e.g., measurement) of the voltage across the bipolar capacitor during that time period.

After this period of time has passed (e.g., after time t2), however, the effects of the inductive impedance of the wiring may end, and voltage signals 792 and 796 may become steady state, as shown in FIGS. 7A and 7B, respectively. Accordingly, voltage signals 792 and 796 may be sampled after time t2 to determine the voltage across the bipolar capacitor, as previously described herein (e.g., in connection with FIG. 5).

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system for detecting faults on a spur wired alarm circuit, comprising:
    a bipolar capacitor coupled to a last device on a spur wired alarm circuit;
    a voltage supply coupled to the spur wired alarm circuit; and
    a controller configured to:
        operate the voltage supply such that a current flows through the spur wired alarm circuit;
        operate the voltage supply such that the current stops flowing through the spur wired alarm circuit for a particular amount of time;
        determine a voltage across the bipolar capacitor while the current has stopped flowing through the spur wired alarm circuit; and
        determine whether a fault has occurred on the spur wired alarm circuit based on the determined voltage.

2. The system of claim 1, wherein the controller is configured to:
    determine a voltage across the voltage supply while the current has stopped flowing through the spur wired alarm circuit; and
    determine the voltage across the bipolar capacitor while the current has stopped flowing through the spur wired alarm circuit based on a determined voltage across the spur wired circuit.

3. The system of claim 1, wherein the controller is configured to determine whether a fault has occurred on the spur wired alarm circuit based on whether the determined voltage meets or exceeds a particular voltage threshold.

4. The system of claim 3, wherein the particular voltage threshold is a minimum operating voltage of the last device on the spur wired alarm circuit while the device is in an alarm state.

5. The system of claim 1, wherein the controller is configured to:
    determine an amount of the current that flows through the spur wired alarm circuit; and
    determine whether the determined current amount is within a particular current range.

6. The system of claim 1, wherein the controller is configured to:
    determine an amount of the current that flows through the spur wired alarm circuit; and
    determine whether the bipolar capacitor is coupled to the last device on the spur wired alarm circuit based on the determined current amount.

7. The system of claim 1, wherein the voltage across the bipolar capacitor while the current has stopped flowing through the spur wired alarm circuit comprises an unfiltered voltage signal.

8. The system of claim 1, wherein the voltage across the bipolar capacitor while the current has stopped flowing through the spur wired alarm circuit comprises a filtered voltage signal.

9. A method for detecting faults on a spur wired alarm circuit, comprising:
    operating a voltage supply such that a current flows through a spur wired alarm circuit having a bipolar capacitor coupled to a last device on the spur wired alarm circuit;
    operating the voltage supply such that the current stops flowing through the spur wired alarm circuit for a particular amount of time;
    determining a voltage across the bipolar capacitor while the current has stopped flowing through the spur wired alarm circuit; and
    determining whether a fault has occurred on the spur wired alarm circuit based on the determined voltage.

10. The method of claim 9, wherein the method includes:
    determining a voltage across the voltage supply while the current has stopped flowing through the spur wired alarm circuit; and
    determining the voltage across the bipolar capacitor while the current has stopped flowing through the spur wired alarm circuit by determining a difference between:
        a voltage supplied to the spur wired alarm circuit by the voltage supply while the current flows through the spur wired alarm circuit; and
        the determined voltage across the voltage supply while the current has stopped flowing through the spur wired alarm circuit.

11. The method of claim 9, wherein the current flows through the spur wired alarm circuit while the spur wired alarm circuit is in an alarm state.

12. The method of claim 9, wherein the bipolar capacitor charges while the current flows through the spur wired alarm circuit.

13. The method of claim 9, wherein the method includes determining a fault has occurred on the spur wired alarm circuit upon determining that the determined voltage does not meet or exceed a particular voltage threshold.

14. The method of claim 9, wherein the method includes determining the voltage across the bipolar capacitor after a particular amount of time has passed from an initial time at which the current stops flowing through the spur wired alarm circuit.

15. A system for detecting faults on a spur wired alarm circuit, comprising:
   a bipolar capacitor coupled to a last device on a spur wired alarm circuit;
   a transistor coupled to the spur wired alarm circuit; and
   a controller configured to:
      switch on the transistor such that a current flows through the spur wired alarm circuit;
      switch off the transistor such that the current stops flowing through the spur wired alarm circuit for a particular amount of time;
      determine a voltage across the transistor while the current has stopped flowing through the spur wired alarm circuit;
      determine a voltage across the bipolar capacitor while the current has stopped flowing through the spur wired alarm circuit based on the determined voltage across the transistor; and
      determine whether a fault has occurred on the spur wired alarm circuit based on the determined voltage across the bipolar capacitor.

16. The system of claim 15, wherein the controller is configured to determine the voltage across the bipolar capacitor while the current has stopped flowing through the spur wired alarm circuit by determining a difference between:
   a voltage supplied to the spur wired alarm circuit by the transistor while the current flows through the spur wired alarm circuit; and
   the determined voltage across the transistor while the current has stopped flowing through the spur wired alarm circuit.

17. The system of claim 15, wherein the particular amount of time for which the current stops flowing through the spur wired alarm circuit is 100 microseconds or less.

18. The system of claim 15, wherein the system further includes a current source coupled to the spur wired alarm circuit and configured to provide the current to the spur wired alarm circuit.

19. The system of claim 15, wherein:
   the spur wired alarm circuit is part of a fire alarm system; and
   at least the last device on the spur wired alarm circuit is an alarm device.

20. The system of claim 15, wherein the transistor coupled to the spur wired alarm circuit is a metal-oxide semiconductor field-effect transistor (MOSFET).

\* \* \* \* \*